United States Patent
Takano et al.

(10) Patent No.: US 7,723,739 B2
(45) Date of Patent: May 25, 2010

(54) SEMICONDUCTOR LIGHT EMITTING DEVICE AND ILLUMINATING DEVICE USING IT

(75) Inventors: Takayoshi Takano, Kawanishi (JP); Yukihiro Kondo, Hirakata (JP); Junji Ikeda, Suita (JP); Hideki Hirayama, Asaka (JP)

(73) Assignees: Panasonic Electric Works Co., Ltd., Kadoma-Shi (JP); Riken, Wako-Shi (JP)

( * ) Notice: Subject to any disclaimer, the term of this patent is extended or adjusted under 35 U.S.C. 154(b) by 0 days.

(21) Appl. No.: 11/991,418
(22) PCT Filed: Sep. 4, 2006
(86) PCT No.: PCT/JP2006/317443

§ 371 (c)(1),
(2), (4) Date: Apr. 7, 2008

(87) PCT Pub. No.: WO2007/029638

PCT Pub. Date: Mar. 15, 2007

(65) Prior Publication Data
US 2009/0001409 A1    Jan. 1, 2009

(30) Foreign Application Priority Data
Sep. 5, 2005    (JP) .............................. 2005-256826

(51) Int. Cl.
*H01L 33/00* (2010.01)
(52) U.S. Cl. .............................. 257/95; 257/96; 257/97; 257/103; 257/E33.026; 257/E33.028
(58) Field of Classification Search .................... 257/95, 257/96, 97, 103, E33.026, E33.028
See application file for complete search history.

(56) References Cited

U.S. PATENT DOCUMENTS 5,793,054 A    8/1998    Nido et al.

(Continued)

FOREIGN PATENT DOCUMENTS

JP    09-008412    1/1997

(Continued)

OTHER PUBLICATIONS

Korean Official Action dated Feb. 9, 2010 issued in Korean Patent Application No. 10-2008-7008064.

*Primary Examiner*—Ngan Ngo
(74) *Attorney, Agent, or Firm*—Edwards Angell Palmer & Dodge LLP

(57) ABSTRACT

A semiconductor light emitting device includes an n-type nitride semiconductor layer 3 formed on one surface side of a single-crystal substrate 1 for epitaxial growth through a first buffer layer 2, an emission layer 5 formed on a surface side of the n-type nitride semiconductor layer 3, and a p-type nitride semiconductor layer 6 formed on a surface side of the emission layer 5. The emission layer 5 has an AlGaInN quantum well structure, and a second buffer layer 4 having the same composition as a barrier layer 5a of the emission layer 5 is provided between the n-type nitride semiconductor layer 3 and the emission layer 5. In the semiconductor light emitting device, it is possible to increase emission intensity of the ultraviolet radiation as compared with a conventional configuration while using AlGaInN as a material of the emission layer.

12 Claims, 4 Drawing Sheets

U.S. PATENT DOCUMENTS

| | | |
|---|---|---|
| 5,990,495 A | 11/1999 | Ohba et al. |
| 2002/0024055 A1* | 2/2002 | Uemura et al. ............... 257/98 |
| 2002/0056846 A1* | 5/2002 | Tsuda et al. ................. 257/86 |
| 2003/0057444 A1 | 3/2003 | Niki et al. |
| 2005/0001227 A1 | 1/2005 | Niki et al. |
| 2008/0303043 A1 | 12/2008 | Niki et al. |
| 2009/0042328 A1 | 2/2009 | Niki et al. |

FOREIGN PATENT DOCUMENTS

| | | |
|---|---|---|
| JP | 09-064477 | 3/1997 |
| JP | 11-017277 | 1/1999 |
| JP | 2003-318441 | 11/2003 |
| JP | 2004-179532 | 6/2004 |
| JP | 2005-109524 | 4/2005 |

* cited by examiner

SEMICONDUCTOR LIGHT EMITTING DEVICE AND ILLUMINATING DEVICE USING IT

BACKGROUND OF THE INVENTION

1. Field of the Invention

The present invention relates to a semiconductor light emitting device and an illuminating device using it.

2. Description of the Related Art

In recent years, a nitride semiconductor including nitrogen in V group element has received attention in a field of a semiconductor light emitting device such as a light-emitting diode and a laser diode using p-n junction, and it is researched and developed in many places. The reason why the nitride semiconductor receives attention is that the nitride semiconductor, including AlN, GaN, and InN, is a direct transition semiconductor and, in a ternary mixed crystal and quaternary mixed crystal, it is possible to emit light from infrared up to deep-ultraviolet by changing a bandgap by setting the composition appropriately.

However, in manufacturing a semiconductor light emitting device using a nitride semiconductor, because it is difficult to manufacture a substrate for epitaxial growth which is made of nitride semiconductor and has high quality and large area, it is necessary to use, e.g., a sapphire substrate and a silicon carbide substrate as a substrate for epitaxial growth. However, in such a case, heteroepitaxial growth is imposed, and it is difficult to grow a nitride semiconductor thin-film having a flat surface. So, a density of threading dislocation in the nitride semiconductor thin-film is as much as $10^9$ to $10^{11}$ cm$^{-2}$. Because the threading dislocation causes descent of internal quantum efficiency of a semiconductor light emitting device, a technique for reducing dislocation and a selection of a material of an emission layer which is insusceptible to dislocation are researched so as to increase internal quantum efficiency of the semiconductor light emitting device.

As to the technique of reduction of the dislocation, a GaN layer is centrally researched, and various techniques, such as the introduction of a low-temperature buffer layer, epitaxial lateral overgrowth using a selective growth mask, and an anti-surfactant method which controls a surface structure by adding anti-surfactant (e.g. Si), which comprised of an impurity atom for inducing three-dimensional growth, to a surface of a foundation layer (e.g. a GaN buffer layer) are examined, and a substrate for epitaxial growth having low lattice mismatch is examined. It is reported that it is possible to reduce the threading dislocation density in the GaN layer to about $10^5$ cm$^{-2}$. However, in a AlGaN ternary mixed crystal, it is known that an effect which can be obtained by using the above-mentioned technique of the reduction of the dislocation is small, so it is necessary to examine the technique of reduction of the dislocation more in AlGaN which is used as a material of the semiconductor light emitting device for emitting light in an ultraviolet region.

On the other hand, as an emission layer material which is insusceptible to the threading dislocation, InGaN ternary mixed crystal has been in the limelight. InGaN is strong in immiscibility, and a composition of In in a crystal becomes unevenness with increase of the composition of In, and a carrier injected in an InGaN layer recombines in a region having high composition of In before it is captured by the threading dislocation. So, it becomes possible to increase internal quantum efficiency dramatically in spite of high degree of threading dislocation by using InGaN in the emission layer.

However, if In is included in the emission layer material, an emission wavelength shifts to a long wavelength side. So, many semiconductor light emitting devices which emit light of ultraviolet region adopt AlGaN which does not include In as a material of the emission layer, so the internal quantum efficiency is low.

Here, in order to increase the quality of an AlGaN layer, it is known that, when a single-crystal substrate for epitaxial growth is a sapphire substrate, it is desired that the AlGaN layer grows on an AlN layer as a foundation layer. This is because, by growing the AlGaN layer on the AlN layer a lattice mismatch between the AlGaN layer and the foundation layer becomes small as compared with a case where the AlGaN layer grows directly on the sapphire substrate, and the threading dislocation is less likely to occur in the AlGaN layer. Furthermore, this is because distortion is added to the AlGaN layer in a direction that the AlGaN layer is compressed, and adjacent threading dislocations in the AlGaN layer are united to each other, which enables reduction of the dislocation and prevents generation of crack. It is also known that, when the AlN layer is a foundation layer, it is preferable that the AlN layer grows directly on the sapphire substrate without a low-temperature buffer layer.

Also, in recent years, a semiconductor light emitting device which uses AlGaInN quaternary mixed crystal as a material of an emission layer to emit light of ultraviolet region has been in the limelight (see Japanese Patent Application Laid-Open No.9-64477). Although the AlGaInN layer includes In, it is reported that it is possible to set an emission peak wavelength to a wavelength region below 360 nm and it is possible to improve the internal quantum efficiency to the same level as the InGaN layer. Furthermore, the AlGaInN layer enables a crystal to grow in a temperature range more than 800 degrees C. at which the InGaN layer cannot allow a crystal to grow, so it has an advantage that it becomes easy to obtain a crystal with higher quality.

So, it is expected to realize an ultraviolet-emitting device which emits light at higher efficiency by combining the technology for increasing quality of the AlGaN layer and the technology which uses AlGaInN quaternary mixed crystal as a material of the emission layer.

However, an n-type GaN layer or an n-type AlGaN layer used for an n-type nitride semiconductor layer that is to be a foundation of an emission layer grows in a temperature range more than 1000 degrees while a growth temperature for forming an emission layer including In is usually 600 to 750 degrees C. So, in order to form the emission layer after forming the n-type nitride semiconductor layer, it is necessary to interrupt the growth to change substrate temperature. Therefore, a surface of the n-type nitride semiconductor layer may be polluted before the emission layer is formed. Furthermore, because the lattice mismatch between the n-type AlGaN layer which is an n-type nitride semiconductor and the AlGaInN layer which is an emission layer is large, the internal quantum efficiency may be reduced even if an n-type nitride semiconductor layer which is comprised of an n-type AlGaN layer having high quality is formed and a material having high efficiency as a material of the emission layer is used.

SUMMARY OF THE INVENTION

In view of the above problem, the object of the present invention is to provide a semiconductor light emitting device capable of increasing emission intensity of ultraviolet radiation as compared with a conventional configuration while using AlGaInN as a material of the emission layer, and an illuminating device capable of increasing output of ultraviolet radiation as compared with a conventional configuration.

A semiconductor light emitting device of the present invention comprises an n-type nitride semiconductor layer formed on one surface side of a single-crystal substrate for epitaxial growth through a first buffer layer, an emission layer formed on a surface side of the n-type nitride semiconductor layer, and a p-type nitride semiconductor layer formed on a surface side of the emission layer. The feature of the present invention resides in that the emission layer has an AlGaInN quantum well structure, and a second buffer layer having the same composition as a barrier layer of the emission layer is provided between the n-type nitride semiconductor layer and the emission layer.

In this case, it is possible to reduce a density of threading dislocation of the emission layer and to reduce residual strain generated in the emission layer by providing the second buffer layer between the n-type nitride semiconductor layer and the emission layer. Furthermore, because the second buffer layer has the same composition as the barrier layer of the emission layer, it is possible to employ the same growth temperature to the second buffer layer and the barrier layer of the emission layer in manufacturing. So, it is possible to continuously grow the barrier layer of the emission layer on the second buffer layer, without interrupting the growth, after the growth of the second buffer layer which is to be a foundation layer of the emission layer, and it is possible to increase the quality of the interface between the second buffer layer and the emission layer. Therefore, as compared with a conventional configuration in which the second buffer layer having the same composition as the barrier layer of the emission layer is not provided between the n-type nitride semiconductor layer and the emission layer having the AlGaInN quantum well structure, it is possible to increase emission intensity of the ultraviolet radiation emitted from the emission layer having the AlGaInN quantum well structure, and as a result, it is possible to increase intensity of the current injection emission spectrum.

Preferably, the first buffer layer is comprises of an AlN layer.

In a case where AlGaN is adopted as a material of the n-type nitride semiconductor layer, when the AlN layer is grown as the first buffer layer which is to be the foundation layer of the n-type nitride semiconductor layer, the lattice mismatch between the first buffer layer and the n-type nitride semiconductor layer becomes small as compared with a case where a GaN layer is grown as the first buffer layer. So, it is possible to perform the reduction of the dislocation of the n-type nitride semiconductor layer, and it is possible to prevent occurrence of a crack in the n-type nitride semiconductor layer.

Preferably, the n-type nitride semiconductor layer is comprised of an AlGaN layer.

In this case, it is possible to increase the quality of the n-type nitride semiconductor layer.

Preferably, the first buffer layer and the second buffer layer have different lattice constants from each other, and relative proportions of the n-type nitride semiconductor layer is changed so that a lattice constant of the n-type nitride semiconductor layer approaches from the lattice constant of the first buffer layer to the lattice constant of the second buffer layer with distance from the first buffer layer.

In this case, it is possible to reduce the strain generated in the second buffer layer by a difference of the lattice constant between the first buffer layer and the second buffer layer, and it is possible to improve the crystal property of the second buffer layer, and as a result, it is possible to improve the crystal property of the emission layer.

In the above case, it is preferable that the second buffer layer has a film thickness which is larger than that of the barrier layer.

In this case, it is possible to improve crystal property of the second buffer layer, and as a result, it is possible to improve the crystal property of the emission layer and to increase reproducibility.

Preferably, a concave-convex structure for increasing light output efficiency is formed on an exposed surface of at least one of the single-crystal substrate, the n-type nitride semiconductor layer, and the p-type nitride semiconductor layer.

In this case, it is possible to increase the light output efficiency.

The illuminating device of the present invention has a feature that it uses the above-mentioned semiconductor light emitting device of the present invention.

In this case, it is possible to realize an illuminating device capable of increasing the output of the ultraviolet radiation as compared with the conventional art.

DETAILED DESCRIPTION OF EXEMPLARY EMBODIMENTS

Hereinafter, the present invention will be described in more detail with reference to the accompanying drawings.

First Embodiment

Figure 1:
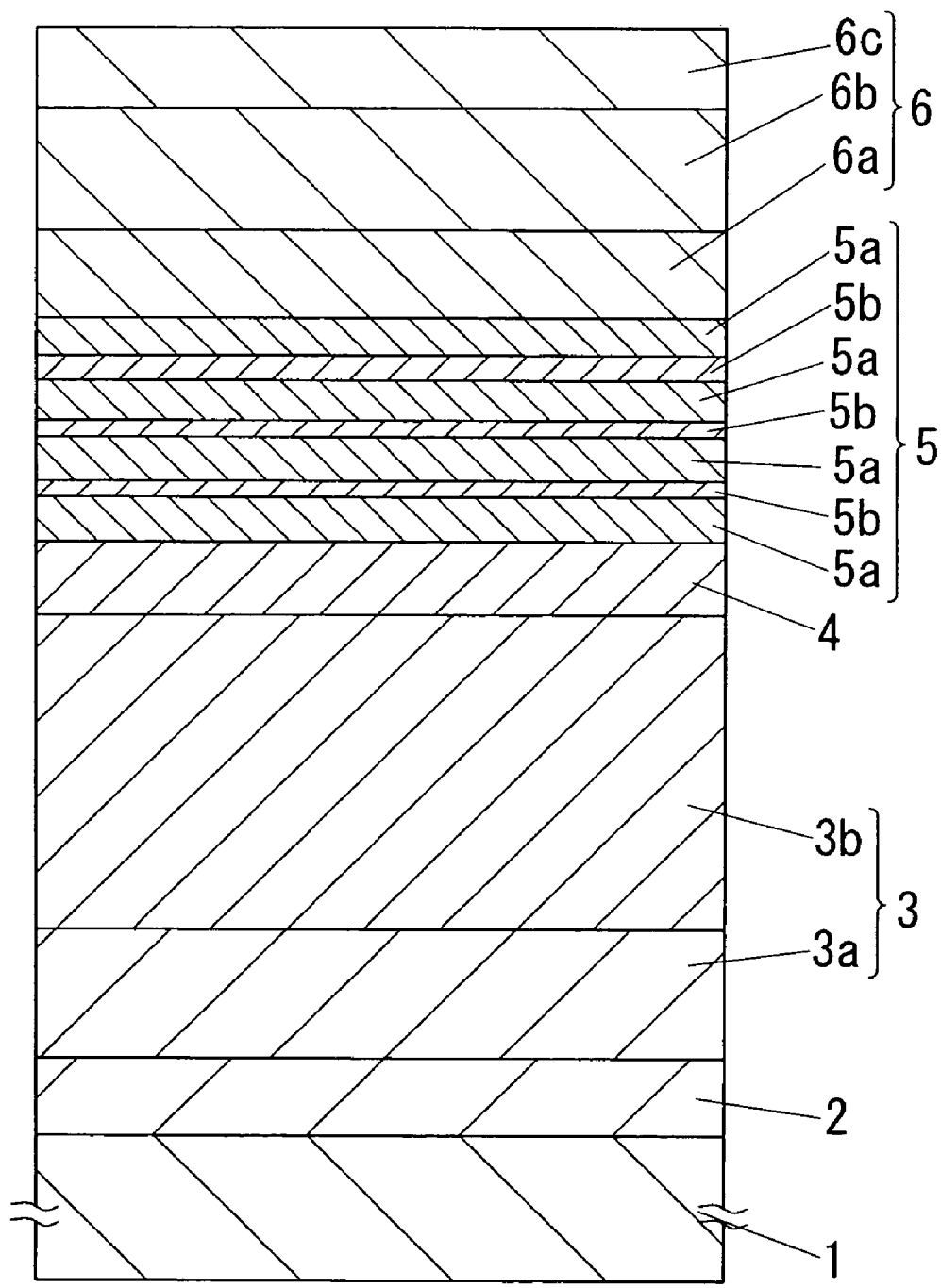
FIG. 1 is a schematic cross sectional view of a semiconductor light emitting device of a first embodiment of the present invention.

A semiconductor light emitting device of this embodiment is an ultraviolet light-emitting diode, and as shown in FIG. 1, an n-type nitride semiconductor layer 3 is formed on one surface side of a single-crystal substrate 1 for epitaxial growth through a first buffer layer 2, and an emission layer 5 is formed on a surface side of the n-type nitride semiconductor layer 3 through a second buffer layer 4, and a p-type nitride semiconductor layer 6 is formed on a surface side of the emission layer 5. A cathode electrode (not shown) is formed on the n-type nitride semiconductor layer 3, and an anode electrode (not shown) is formed on the p-type nitride semiconductor layer 6.

As the single-crystal substrate 1, a sapphire substrate whose above-mentioned one surface is a (0001) surface, namely, C surface is used.

The first buffer layer 2 is formed to reduce threading dislocation of the n-type nitride semiconductor layer 3 and to reduce residual strain of the n-type nitride semiconductor layer 3, and it is constituted by an AlN layer of a single-crystal having 0.5 μm in film thickness. The film thickness of the first buffer layer 2 is not limited to 0.5 μm.

As to a method for forming the first buffer layer 2, the single-crystal substrate 1 comprised of a sapphire substrate is introduced in a reactor of MOVPE equipment, and a substrate temperature is raised to a predetermined temperature e.g. 1250 degrees C. while keeping a pressure in the reactor at a predetermined growth pressure (e.g. 10 kPa≈76 Torr), and it is heated for a predetermined time period (e.g. 10 minutes) to clean the one surface of the single-crystal substrate 1. Then, while keeping the substrate temperature at the growth temperature which is equal to the above-mentioned predetermined temperature (1250 degrees C.), a flow rate of trimethylaluminum (TMAl), which is a material of aluminum, is set to 0.05 L/min (50 SCCM) in a normal condition, and a flow rate of ammonia ($NH_3$), which is a material of nitrogen, is set to 0.1 L/min (10 SCCM) in a normal condition. And then, the TMAl and the $NH_3$ are provided in the reactor at the same time to grow the first buffer layer 2 comprised of the AlN layer of a single-crystal. By adopting the above-mentioned forming method for the first buffer layer 2, it is possible to grow the AlN layer of a single crystal without using a low-temperature AlN buffer layer. As the first buffer layer 2, it is not limited to the AlN layer of a single crystal, but an AlGaN layer of a single crystal may be adopted.

The n-type nitride semiconductor layer 3 includes a first n-type AlGaN layer 3a comprised of an n-type $Al_{0.35}Ga_{0.65}N$ layer formed on the first buffer layer 2 and a second n-type AlGaN layer 3b comprised of an n-type $Al_{0.2}Ga_{0.8}N$ layer formed on the first n-type AlGaN layer 3a. In the first n-type AlGaN layer 3a and the second n-type AlGaN layer 3b for constituting the n-type nitride semiconductor layer 3, relative proportions are changed so that a lattice constant thereof approaches from a lattice constant of the first buffer layer 2 to a lattice constant of the second buffer layer 4 with distance from the first buffer layer 2. Here, in the nitride semiconductor layer 3, the film thickness of the first n-type AlGaN layer 3a is set to 1 μm and the film thickness of the second n-type AlGaN layer 3b is set to 2 μm. However, the film thickness of each n-type AlGaN layer 3a, 3b is not particularly limited.

As the growth condition of the n-type nitride semiconductor layer 3, the growth temperature is set to 1100 degrees C., the growth pressure is set to the above-mentioned predetermined growth pressure (here, 10 kPa), and TMAl is used as a material of aluminum, trimethylgallium (TMGa) is used as a material of gallium, $NH_3$ is used as a material of nitrogen, and tetraethylsilicon (TESi) is used as a material of silicon which is an impurity for providing n-type conductivity. As a carrier gas for transporting each material, $N_2$ gas and $H_2$ gas are used. The flow rate of TESi when each layer 3a, 3b grows is set to 0.00005 L/min (0.05 SCCM) in the normal condition, and a mole ratio (a flow rate ratio) of group-III material is changed appropriately between when the first n-type AlGaN layer 6a grows and when the second n-type AlGaN layer 6b grows. Each material is not limited particularly, and for example, triethylgallium (TEGa) and silane ($SiH_4$) are used as a material of gallium and silicon, respectively.

The second buffer layer 4 is formed for reducing threading dislocation of the emission layer 5n and for reducing residual strain of the emission layer 5, and it is constituted by an $Al_{0.30}Ga_{0.64}In_{0.06}N$ layer having 50 nm in film thickness. The composition of the second buffer layer 4 is not particularly limited as long as it is the same as the composition of the barrier layer 5a of the emission layer 5. And the film thickness of the second buffer layer 4 is not particularly limited to 50 nm.

As the growth condition of the second buffer layer 4, the growth temperature is set to 800 degrees C., and the growth pressure is set to the above-mentioned predetermined growth pressure (here, 10 kPa). And, TMAl is used as a material of aluminum, TMGa is used as a material of gallium, trimethylindium (TMIn) is used as a material of indium, and $NH_3$ is used as a material of nitrogen. As carrier gas for transporting each material, $N_2$ gas is used.

The emission layer 5 has an AlGaInN quantum well structure (in this embodiment, a multiple quantum well structure is adopted, but a single quantum well structure may be used.), and the barrier layer 5a is constituted by an $Al_{0.30}Ga_{0.64}In_{0.06}N$ layer having 10 nm in film thickness, and an well layer 5b is constituted by $Al_{0.15}Ga_{0.79}In_{0.06}N$ layer having 2 nm in film thickness. In this embodiment, the emission layer 5 has a multiple quantum well structure with three well layers 5b aligned in a thickness direction, but the number of the well layers 5b is not particularly limited, and for example, a single quantum well structure with one well layer 5b may be adopted. And, the film thickness of respective barrier layer 5a and the well layer 5b is not particularly limited.

As to the growth condition of the emission layer 5, the growth temperature is set to 800 degrees C., which is the same as the second buffer layer 4, and the growth pressure is set to the above-mentioned predetermined growth pressure (here, 10 kPa). And, TMAl is used as a material of aluminum, TMGa is used as a material of gallium, TMIn is used as a material of indium, and $NH_3$ is used as a material of nitrogen. As carrier gas for transporting each material, $N_2$ gas is used. Although a mole ratio (a flow rate ratio) of group-III material is changed appropriately between when the barrier layer 5a grows and when the well layer 5b grows, because the barrier layer 5a and the second buffer layer 4 are set to have the same composition, it is possible to grow the barrier layer 5a which is the lowest layer of the emission layer 5 without interrupting the growth after the growth of the second buffer layer 4.

The p-type nitride semiconductor layer 6 includes a first p-type AlGaN layer 6a comprised of a p-type $Al_{0.3}Ga_{0.7}N$ layer formed on the emission layer 5, a second p-type AlGaN layer 6b comprised of a p-type $Al_{0.2}Ga_{0.8}N$ layer formed on the first p-type AlGaN layer 6a, and a p-type GaN layer 6c formed on the second p-type AlGaN layer 6b. In the p-type nitride semiconductor layer 6, the film thickness of the first p-type AlGaN layer 6a is set to 20 nm, the film thickness of the second p-type AlGaN layer 6b is set to 300 nm, and the film thickness of the p-type GaN layer 6c is set to 50 nm. However, these film thicknesses are not particularly limited.

As the growth condition of the first p-type AlGaN layer 6a and the second p-type AlGaN layer 6b of the p-type nitride semiconductor layer 6, the growth temperature is set to 1050 degrees C., and the growth pressure is set to the above-mentioned predetermined growth pressure (here, 10 kPa). TMAl is used as a material of aluminum, TMGa is used as a material of gallium, $NH_3$ is used as a material of nitrogen, and biscyclopentadienylmagnesium ($Cp_2Mg$) is used as a material of magnesium which is an impurity for providing p-type conductivity. As carrier gas for transporting each material, $H_2$ gas is used. When each layer 6a, 6b, and 6c grows, the flow rate of $Cp_2Mg$ is set to 0.02 L/min (20 SCCM) in the normal condition.

Figure 2:
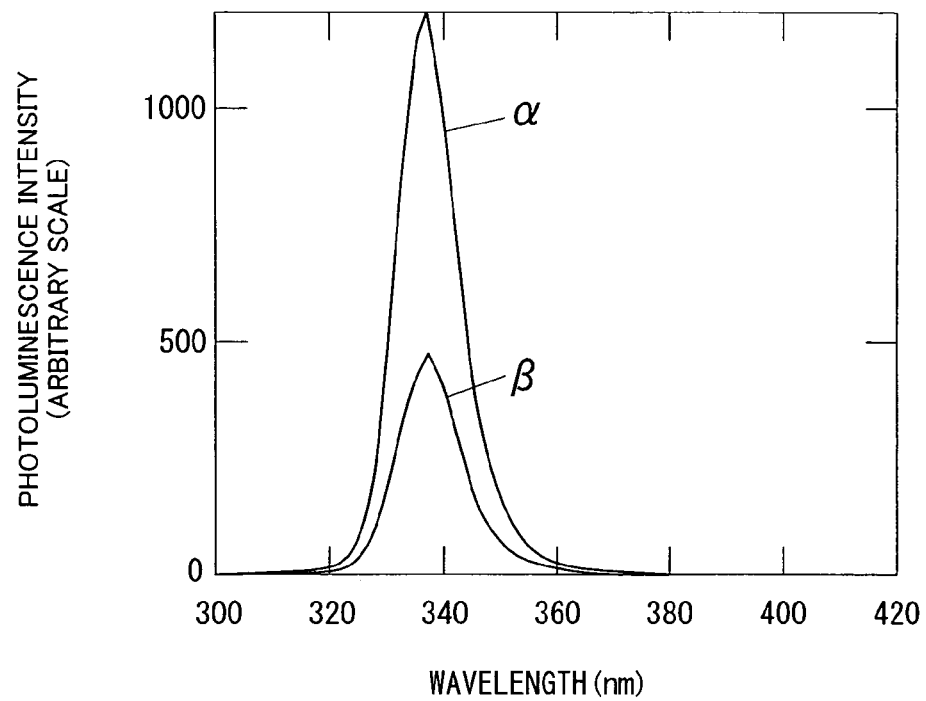
FIG. 2 is an emission spectrum view showing photoluminescence measuring results of an example of the first embodiment and a comparative example.

By the way, in order to confirm the effect of the second buffer layer 4 provided between the n-type nitride semiconductor layer 3 and the emission layer 5, a sample of the embodiment in which the second buffer layer 4 is provided and a sample of a comparative example in which the second buffer layer 4 is not provided are prepared, and the emission layer 5 in each sample is exposed to measure photoluminescence (PL). The results are shown in FIG. 2. In FIG. 2, 'a' shows the PL spectrum of the embodiment, and 'β' shows the PL spectrum of the comparative example. From FIG. 2, it can be found that the emission intensity of the emission layer 5 is increased by providing the second buffer layer 4 between the n-type nitride semiconductor layer 3 and the emission layer 5.

Figure 3:
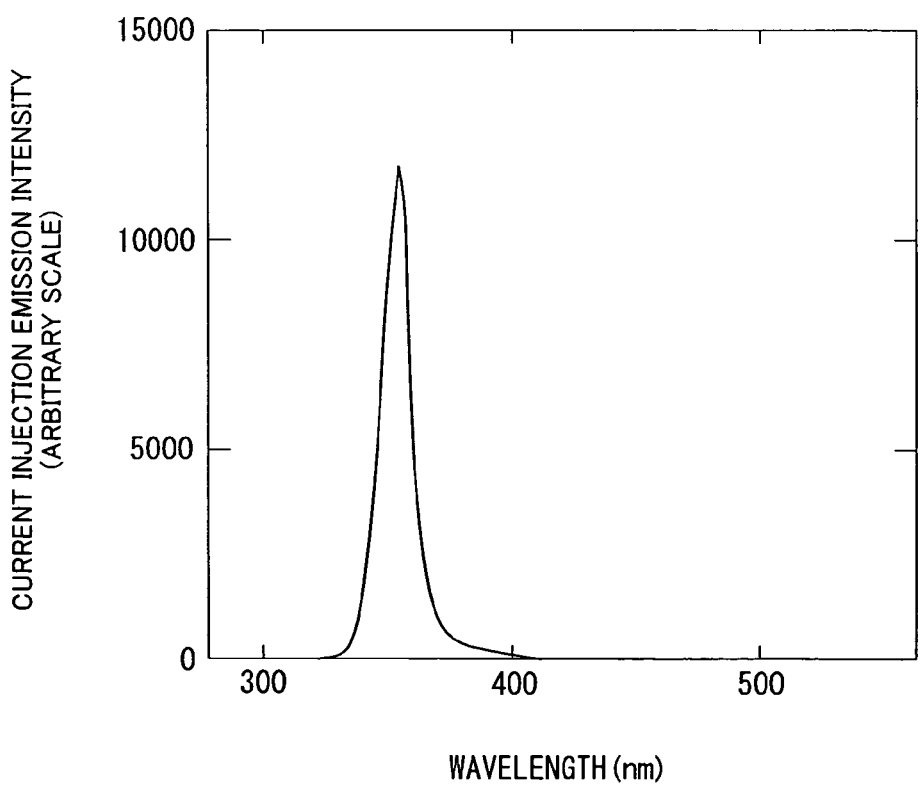
FIG. 3 is a current injection emission spectrum view of the example of the first embodiment.

And, FIG. 3 shows a measurement result of current injection emission spectrum of the embodiment in which the layers 2, 3, 4, 5, and 6 are formed by the illustrated materials, the illustrated relative proportions, and the illustrated film thicknesses. The current value in measuring the current injection emission spectrum is 40 mA, and good current injection emission spectrum having emission peak wavelength in 350 nm was measured.

In the semiconductor light emitting device of this embodiment explained above, it is possible to reduce a density of the threading dislocation of the emission layer 3 and to reduce residual strain generated in the semiconductor layer 3 by providing the second buffer layer 4 between the n-type nitride semiconductor layer 3 and the emission layer 5. Furthermore, because the second buffer layer 4 has the same composition as the barrier layer 5a of the emission layer 5, it is possible to employ the same growth temperature to the second buffer layer 4 and the barrier layer 5a of the emission layer 5 in manufacturing, so it is possible to continuously grow the barrier layer 5b of the emission layer 5 on the second buffer layer 4, without interrupting the growth, after the growth of the second buffer layer 4 which is to be a foundation layer of the emission layer 5, and it is possible to increase the quality of the interface between the second buffer layer 4 and the emission layer 5. Therefore, as compared with a conventional configuration in which the second buffer layer 4 having the same composition as the barrier layer 5a of the emission layer 5 is not provided between the n-type nitride semiconductor layer 3 and the emission layer 5 having an AlGaInN quantum well structure, it is possible to increase emission intensity of the ultraviolet radiation emitted from the emission layer 5 having the AlGaInN quantum well structure, and as a result, it is possible to increase intensity of the current injection emission spectrum.

Furthermore, in the semiconductor light emitting device of this embodiment, because the above-mentioned AlGaN is adopted as a material of the n-type nitride semiconductor layer 3 and the AlN layer is grown as the first buffer layer 2 which is to be the foundation layer of the n-type nitride semiconductor layer 3, the lattice mismatch between the first buffer layer 2 and the n-type nitride semiconductor layer 3 becomes small as compared with a case where a GaN layer is grown as the first buffer layer 2. So, it is possible to reduce the dislocation of the n-type nitride semiconductor layer 3, and it is possible to prevent occurrence of crack in the n-type nitride semiconductor layer 3. Still furthermore, because the n-type nitride semiconductor layer 3 is comprised of the AlGaN layer in the semiconductor light emitting device of this embodiment, it is possible to increase quality of the n-type nitride semiconductor layer 3.

Although the lattice constant of the first buffer layer 2 and the lattice constant of the second buffer layer 4 are different from each other in the semiconductor light emitting device of this embodiment, because the relative proportions of the n-type nitride semiconductor layer 3 are changed so that the lattice constant approaches from the lattice constant of the first buffer layer 2 to the lattice constant of the second buffer layer 4 with distance from the first buffer layer 2, it is possible to reduce the strain generated in the second buffer layer 4 by a difference of the lattice constant between the first buffer layer 2 and the second buffer layer 4, and it is possible to improve the crystal property of the second buffer layer 4, and as a result, it is possible to improve the crystal property of the emission layer 5. Furthermore, because the film thickness of the second buffer layer 4 is set to be larger than that of the barrier layer 5a in the semiconductor light emitting device of this embodiment, it is possible to improve the crystal property of the second buffer layer 4, whereby it is possible to improve the crystal property of the emission layer 5 and to increase reproducibility.

Second Embodiment

Figure 4:
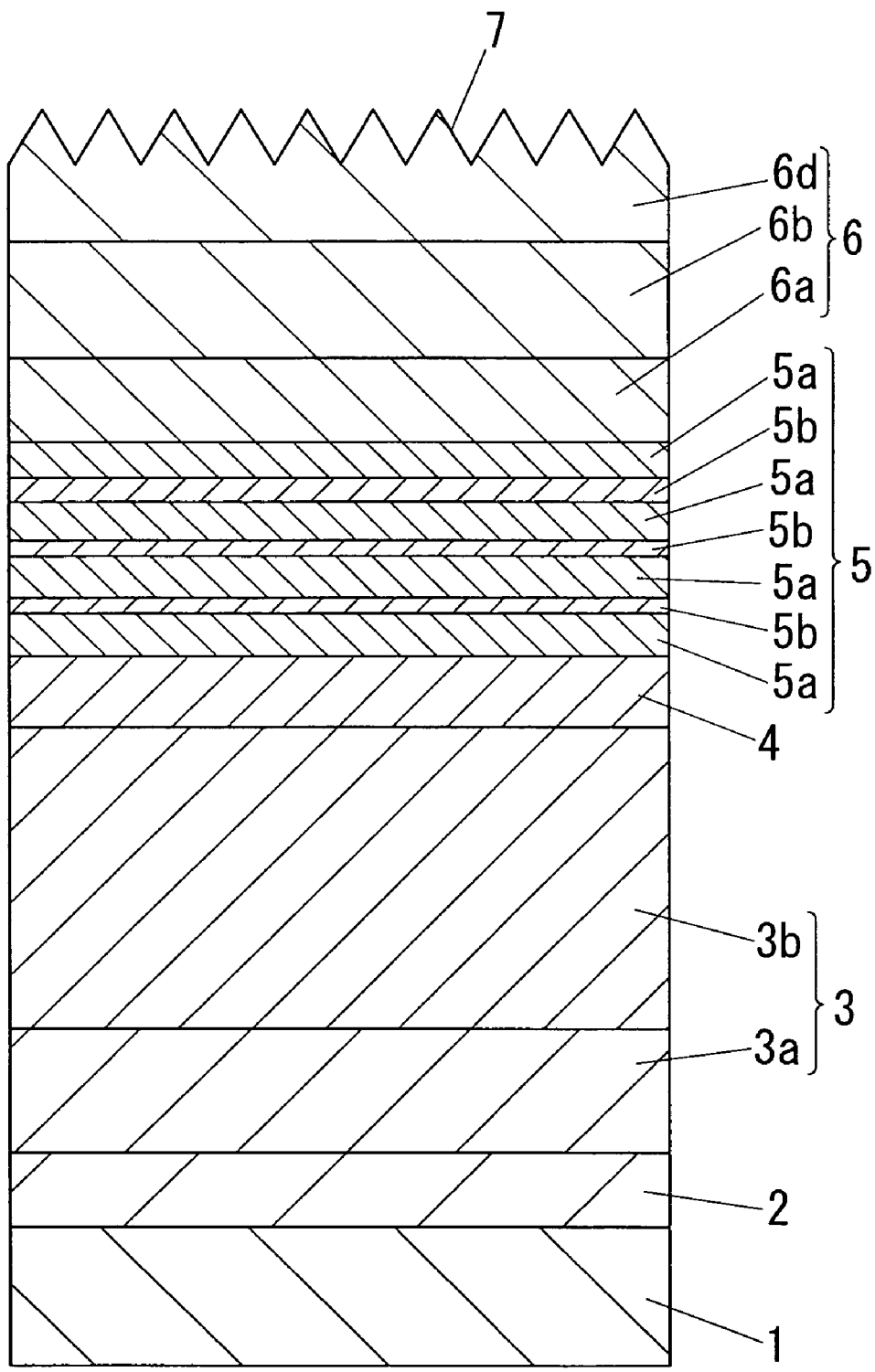
FIG. 4 is a schematic cross sectional view of a semiconductor light emitting device of a second embodiment of the present invention.

The basic composition of a semiconductor light emitting device of this embodiment is identical to the first embodiment, but as shown in FIG. 4, it is different from the first embodiment in that a p-type $In_{0.05}Ga_{0.95}N$ layer 6d is used as a substitute for the p-type GaN layer 6c of the p-type nitride semiconductor layer 6 in the first embodiment and a concave-convex structure 7 for increasing light output efficiency is formed on the surface of the p-type nitride semiconductor layer 6, that is, a surface of the p-type $In_{0.05}Ga_{0.95}N$ layer 6d. Similar parts to the first embodiment are identified by the same reference character and no duplicate explanation is made here.

In forming the p-type $In_{0.05}Ga_{0.95}N$ layer 6d, the growth temperature is set to 800 degrees C., the growth pressure is set to the predetermined growth pressure (here, 10 kPa), and TMIn is used as a material of indium, TMGa is used as a material of gallium, $NH_3$ is used as a material of nitrogen, and $N_2$ gas is used as carrier gas for transporting each material. By this, pits are formed on the surface of the p-type $In_{0.05}Ga_{0.95}N$ layer 6d while reflecting the positions of the threading dislocations of the second p-type AlGaN layer 6b which is a foundation layer, which forms the above-mentioned concave-convex structure 7. So, it is not necessary to prepare a process for forming the concave-convex structure 7 separately.

However, the method for forming the concave-convex structure 7 on the surface of the p-type nitride semiconductor layer 6 is not limited to the above-mentioned method. For example, in the constitution of the first embodiment, the p-type GaN layer 6c having the concave-convex structure 7 on its surface may be grown on the second p-type AlGaN layer 6b by using anti-surfactant method, or the concave-convex structure 7 may be formed by etching the surface of the p-type GaN layer 6c by using hydrochloric acid, sulfuric acid, mixed solution of hydrochloric acid and sulfuric acid, sodium hydroxide, and potassium hydroxide, or the concave-convex structure 7 may be formed by etching the surface of the p-type GaN layer 6c by using plasma.

In this embodiment, although the concave-convex structure 7 is formed on an exposed surface of the p-type nitride semiconductor layer 6, the region where the concave-convex structure 7 for increasing the light output efficiency is formed is not limited to the surface of the p-type nitride semiconductor layer 6. For example, the concave-convex structure 7 may be formed on an exposed surface of the single-crystal substrate 1 or an exposed surface of the n-type nitride semiconductor layer 3 which is exposed by etching a predetermined region from the surface side of the p-type nitride semiconductor layer 6 to a depth which reaches the n-type nitride semiconductor layer 3.

When an asperity is formed on a growth surface of the first n-type AlGaN layer 3a on the first buffer layer 2 side out of the n-type nitride semiconductor layer 3, it is possible to reduce the threading dislocation of the second n-type AlGaN layer 3b, and as a result, it is possible to reduce the threading dislocation of the emission layer 5. In order to form the asperity on the growth surface of the first n-type AlGaN layer 3a, a third buffer layer formed from the same material (AlN) as the first buffer layer may be formed on the first buffer layer 2 at a formation temperature which is a predetermined degrees (for example, 100 degrees C.) lower than a formation temperature of the first buffer layer 2, and then the first n-type AlGaN layer 3a may be formed.

Third Embodiment

Figure 5:
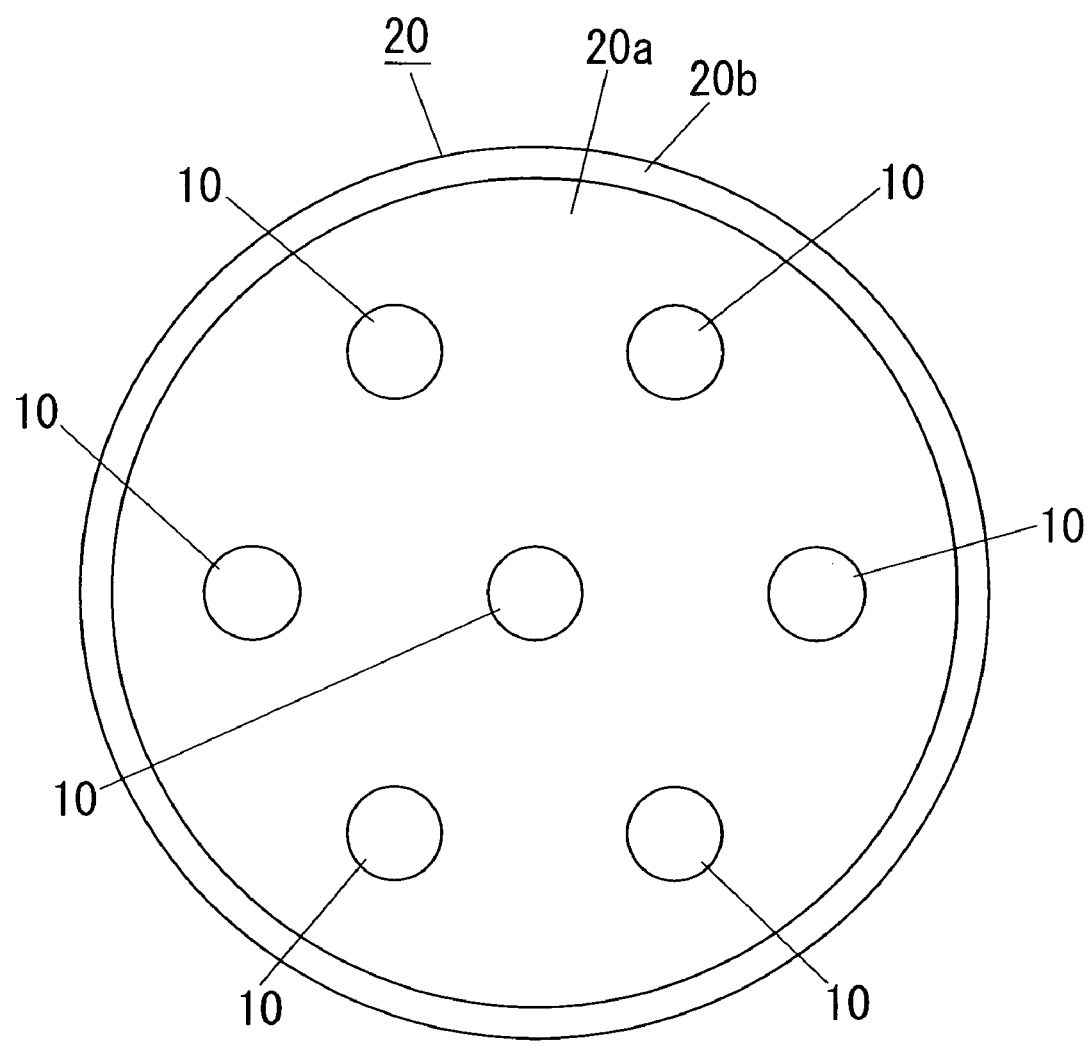
FIG. 5 is a schematic front view of an illuminating device shown in a third embodiment of the present invention.

In this embodiment, as shown in FIG. 5, illustrated is an illuminating device, in which a plurality of (in this figure, seven) luminescent devices 10 each of which houses the semiconductor light emitting device of the first embodiment in a package are housed and arranged in an apparatus body 20 made of metal, e.g., aluminum. Each of the packages of the luminescent devices 10 has a reflector for reflecting the light from the semiconductor light emitting device to a desired direction and lead terminals electrically connected to each electrode of the semiconductor light emitting device. The number of the luminescent devices 10 is not particularly limited.

The apparatus body 20 is formed into a tube-like shape with a bottom (in this embodiment, a cylindrical shape with a bottom) having an opened surface (an opened front surface), and each luminescent device 10 is mounted on a bottom wall 20a of the apparatus body 20 through an insulated layer (not shown) made of a green sheet in a space surrounded by the bottom wall 20a of the apparatus body 20 and a cylindrical peripheral wall 20b. The luminescent devices 10 are connected in series or in parallel with each other by lead wires (not shown). A circuit pattern for connecting the luminescent devices 10 in series or parallel may be formed, and a disk-shaped circuit substrate having a plurality of windows for exposing each luminescent device 10 may be housed in the apparatus body 20.

In the illuminating device of this embodiment, each luminescent device 10 is electrically insulated from the apparatus body 20 and thermally connected to the apparatus body 20 by mounting each luminescent device 10 on the bottom wall 20a of the apparatus body 20 through the insulated layer. So, as compared with a case where each luminescent device 10 is mounted on a circuit board and the circuit board is housed and arranged in the apparatus body 20, it is possible to reduce the heat thermal resistance from each luminescent device 10 to the apparatus body 20 and it is possible to increase radiation performance. Each luminescent device 10 may be mounted on a circuit substrate, such as a metal based printed circuit board, in which a conductive pattern is formed on a metal plate (for example, an aluminum plate or a copper plate) through an insulated resin layer. In this case, an insulated layer such as a green sheet may be provided between the circuit substrate and the bottom wall 20a of the apparatus body 20.

In the above-mentioned illuminating device of this embodiment, because the semiconductor light emitting device explained in the first embodiment is used as the semiconductor light emitting device which emits ultraviolet radiation, it is possible to increase the output of the ultraviolet radiation as compared with the conventional art. Although, in this embodiment, the semiconductor light emitting device explained in the first embodiment is used as the semiconductor light emitting device, the semiconductor light emitting device explained in the second embodiment may be used.

Although a sapphire substrate is used as the single-crystal substrate 1 in the semiconductor light emitting device in each of the above-mentioned embodiments, the single-crystal substrate 1 is not limited to the sapphire substrate, and a substrate in which a single crystal AlN layer used as the first buffer layer 2 can grow may be used. For example, a spinel substrate, a silicon (Si) substrate, a silicon carbide (SiC) substrate, a zinc oxide substrate, a gallium phosphide (GaP) substrate, a gallium arsenide (GaAs) substrate, a magnesium oxide substrate, a manganese oxide substrate, a zirconium boride substrate, a group-III nitride series semiconductor crystal substrate may be used.

The invention claimed is:

1. A semiconductor light emitting device comprising:
   an n-type nitride semiconductor layer formed on one surface side of a single-crystal substrate for epitaxial growth through a first buffer layer;
   an emission layer formed on a surface side of said n-type nitride semiconductor layer;
   a p-type nitride semiconductor layer formed on a surface side of said emission layer;
   wherein
   said emission layer has an AlGaInN quantum well structure and includes at least a pair of a barrier layer and a well layer,
   a second buffer layer having the same composition as said barrier layer included in the emission layer being provided between said n-type nitride semiconductor layer and said barrier layer.

2. The semiconductor light emitting device as set forth in claim 1, wherein
   said first buffer layer is comprises of an AlN layer.

3. The semiconductor light emitting device as set forth in claim 1, wherein
   said n-type nitride semiconductor layer is comprised of an AlGaN layer.

4. The semiconductor light emitting device as set forth in claim 1, wherein
   said first buffer layer and said second buffer layer have different lattice constants from each other,
   relative proportions of said n-type nitride semiconductor layer being changed so that a lattice constant of said n-type nitride semiconductor layer approaches from a lattice constant of said first buffer layer to a lattice constant of said second buffer layer with distance from said first buffer layer.

5. The semiconductor light emitting device as set forth in claim 4, wherein
   said second buffer layer has a film thickness which is larger than that of said barrier layer.

6. The semiconductor light emitting device as set forth in claim 1, wherein
   a concave-convex structure for increasing light output efficiency is formed on an exposed surface of at least one of said single-crystal substrate, said n-type nitride semiconductor layer, and said p-type nitride semiconductor layer.

7. An illuminating device comprising:
   said semiconductor light emitting device as set forth in claim 1.

8. An illuminating device comprising:
   said semiconductor light emitting device as set forth in claim 2.

9. An illuminating device comprising:
   said semiconductor light emitting device as set forth in claim 3.

10. An illuminating device comprising:
    said semiconductor light emitting device as set forth in claim 4.

11. An illuminating device comprising:
    said semiconductor light emitting device as set forth in claim 5.

12. An illuminating device comprising:
    said semiconductor light emitting device as set forth in claim 6.

* * * * *